US012144193B2

United States Patent
Park et al.

(10) Patent No.: US 12,144,193 B2
(45) Date of Patent: Nov. 12, 2024

(54) DISPLAY DEVICE INCLUDING ANODE ELECTRODE THAT INCLUDES FIRST, SECOND AND THIRD ANODE ELECTRODE LAYERS, AND METHOD OF MANUFACTURING THE SAME

(71) Applicant: Samsung Display Co., Ltd., Yongin-Si (KR)

(72) Inventors: Jong Hee Park, Hwaseong-si (KR); Hyoung Sik Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 344 days.

(21) Appl. No.: 17/556,799

(22) Filed: Dec. 20, 2021

(65) Prior Publication Data

US 2022/0199936 A1       Jun. 23, 2022

(30) Foreign Application Priority Data

Dec. 23, 2020   (KR) .................. 10-2020-0181741

(51) Int. Cl.
  *H10K 50/813*    (2023.01)
  *H10K 50/818*    (2023.01)
  (Continued)

(52) U.S. Cl.
  CPC ......... *H10K 50/813* (2023.02); *H10K 50/818* (2023.02); *H10K 59/12* (2023.02);
  (Continued)

(58) Field of Classification Search
  CPC .... H10K 50/813; H10K 71/40; H10K 71/421; H10K 71/441; H10K 39/621;
  (Continued)

(56) References Cited

U.S. PATENT DOCUMENTS

2016/0013436 A1*  1/2016  Im .................. H10K 50/824
                                                     257/40
2019/0363278 A1  11/2019  Kanda et al.
(Continued)

FOREIGN PATENT DOCUMENTS

| CN | 110556485 A | 12/2019 |
|---|---|---|
| CN | 112103326 A | 12/2020 |

(Continued)

OTHER PUBLICATIONS

Lee, C.-Y., Chang, C., Shih, W.-P., & Dai, C.-L. (2009). Wet etching rates of Ingazno for the fabrication of transparent thin-film transistors on plastic substrates. Thin Solid Films, 518(14), pp. 3992-3998. https://doi.org/10.1016/j.tsf.2009.12.010 (Year: 2009).*
Hiroshi Hara, Takashi Shiro and Toshiaki Yatabe, "Optimization and Properties of Zn Doped Indium Oxide Films on Plastic Substrate", Japanese Journal of Applied Physics, vol. 43. No. 2. 2004, pp. 745-749, published Feb. 10, 2004, Japan.

*Primary Examiner* — Daniel Whalen
*Assistant Examiner* — Seyon Ali-Simah Punchbeddell
(74) *Attorney, Agent, or Firm* — Innovation Counsel LLP

(57) ABSTRACT

An embodiment of a display device comprises a base substrate; an anode electrode disposed on the base substrate; a cathode electrode facing the anode electrode; and an organic light emitting layer disposed between the anode electrode and the cathode electrode, wherein the anode electrode includes: a first anode electrode disposed between the base substrate and the organic light emitting layer, a second anode electrode disposed between the first anode electrode and the organic light emitting layer, and a third anode electrode disposed between the second anode electrode and the organic light emitting layer, wherein a width of the first anode electrode is equal to or greater than a width of the second anode electrode.

19 Claims, 17 Drawing Sheets

(51) Int. Cl.
  *H10K 59/12* (2023.01)
  *H10K 71/00* (2023.01)
  *H10K 102/10* (2023.01)
(52) U.S. Cl.
  CPC ........... *H10K 71/00* (2023.02); *H10K 71/621* (2023.02); *H10K 59/1201* (2023.02); *H10K 2102/103* (2023.02)
(58) Field of Classification Search
  CPC .................. H10K 59/00; H10K 71/00; H10K 59/80515–59/80518; H10K 59/12; H10K 59/1201; H01L 25/162; H01L 25/165; H01L 25/167
  See application file for complete search history.

(56) References Cited

U.S. PATENT DOCUMENTS

| | | | |
|---|---|---|---|
| 2020/0020876 A1 | 1/2020 | Shin et al. | |
| 2020/0135819 A1* | 4/2020 | Kim | ............ H10K 71/231 |
| 2020/0328370 A1 | 10/2020 | Lee | |
| 2022/0093894 A1* | 3/2022 | Song | ............ H10K 59/1315 |

FOREIGN PATENT DOCUMENTS

| | | | | |
|---|---|---|---|---|
| KR | 20060061187 A * | 6/2006 | ............ H01J 17/49 |
| KR | 10-2006-0061187 A | 4/2007 | |
| KR | 10-2015-0134953 A | 12/2015 | |
| KR | 10-2016-0083991 A | 7/2016 | |
| KR | 20190137205 A * | 12/2019 | ............ H10K 59/131 |
| KR | 10-2020-0031432 A | 3/2020 | |

* cited by examiner

DISPLAY DEVICE INCLUDING ANODE ELECTRODE THAT INCLUDES FIRST, SECOND AND THIRD ANODE ELECTRODE LAYERS, AND METHOD OF MANUFACTURING THE SAME

CROSS-REFERENCE TO RELATED APPLICATION

This application claims priority from Korean Patent Application No. 10-2020-0181741 filed on Dec. 23, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method of manufacturing the same.

2. Description of the Related Art

Recently, due to the development of technology, display products that are smaller and lighter and have better performance have been produced. A cathode ray tube (CRT) having many advantages in terms of performance and cost has been widely used as a conventional display device. However, a display device that has solved the drawbacks of the CRT in terms of miniaturization and portability and has advantages such as miniaturization, weight reduction, low power consumption or the like, e.g., a plasma display device, a liquid crystal display device, an organic light emitting display device, or the like, attracts attention.

The display device may include an organic light emitting diode including an anode electrode, a cathode electrode facing the anode electrode, and an organic light emitting layer disposed between the anode electrode and the cathode electrode. Sometimes, the anode electrode is formed of a plurality of stacked layers depending on functions. If a lowermost layer is overetched, the conductive layer disposed below the anode electrode may become defective.

SUMMARY

According to an embodiment, a display device comprises a base substrate; an anode electrode disposed on the base substrate; a cathode electrode facing the anode electrode; and an organic light emitting layer disposed between the anode electrode and the cathode electrode, wherein the anode electrode includes: a first anode electrode disposed between the base substrate and the organic light emitting layer, a second anode electrode disposed between the first anode electrode and the organic light emitting layer, and a third anode electrode disposed between the second anode electrode and the organic light emitting layer, wherein a width of the first anode electrode is equal to or greater than a width of the second anode electrode.

According to an embodiment, a method of manufacturing a display device, comprises forming an active layer on a display area of a base substrate in which the display area and a pad area located around the display area are defined; forming a gate insulating layer on the active layer; forming a first conductive layer on the gate insulating layer, the first conductive layer including a gate electrode on the display area and a first pad electrode on the pad area; forming an interlayer insulating layer on the first conductive layer; forming a second conductive layer on the interlayer insulating layer, the second conductive layer including a source electrode and a drain electrode connected to the active layer on the display area, and a second pad electrode connected to the first pad electrode on the pad area; forming a via layer on the display area except the pad area on the second conductive layer; forming a first anode electrode layer over the display area and the pad area on the via layer; forming a second anode electrode layer over the display area and the pad area on the first anode electrode layer; and forming a third anode electrode layer over the display area and the pad area on the second anode electrode layer, wherein a material of the first anode electrode layer and a material of the third anode electrode layer are different from each other, the material of the third anode electrode layer includes Indium-Tin-Oxide (ITO), the material of the first anode electrode layer includes Indium-Zinc-Oxide (IZO), and the material of the first anode electrode layer has an alloy ratio in which a relative ratio of indium to zinc (In:Zn) is 9:1 to 8:2.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

In accordance with one embodiment, even when the lowermost layer of the anode electrode is overetched, it is possible to provide a method of manufacturing a display device in which the occurrence of defects in a conductive layer disposed below an anode electrode is reduced, and the display device manufactured by such a method.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
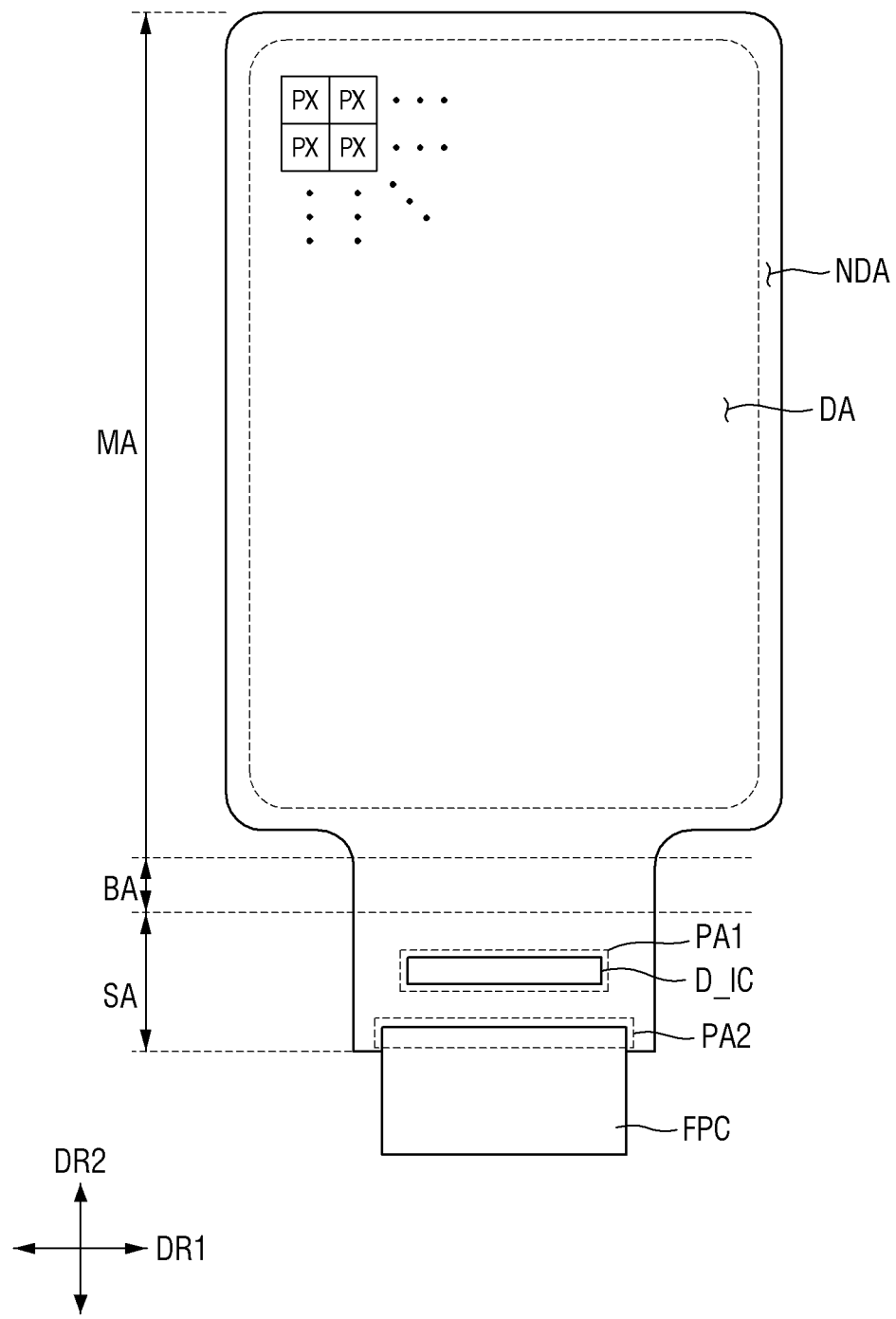
FIG. 1 is a plan view of a display device according to one embodiment.

Embodiments of the present disclosure provide a display device manufactured by a method of manufacturing a display device in which the occurrence of defects in a conductive layer disposed below an anode electrode is reduced even when a lowermost layer of the anode electrode is over-etched.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers or sections, these elements, components, regions, layers or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing embodiments and is not intended to be limiting.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

It will be understood that the terms "comprises" or "comprising," or "includes" or "including" when used in this specification, specify the presence of stated features, regions, integers, steps, operations, elements, or components, but do not preclude the presence or addition of one or more other features, regions, integers, steps, operations, elements, components, or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is a plan view of a display device according to one embodiment.

Referring to FIG. 1, the display device may include a display area DA where an image is displayed and a non-display area NDA adjacent to the display area DA. The display area DA may include a plurality of pixels PX. The non-display area NDA may include no pixel PX. The non-display area NDA may include a first peripheral area surrounding the display area DA, and a second peripheral area protruding downward from the first peripheral area. The second peripheral area may include a bending area BA, a first pad area PA1 where a drive integrated circuit D_IC is located, and a second pad area PA2 where a printed circuit film FPC is located.

The first pad area PA1 may be disposed between the bending area BA and the second pad area PA2 in plan view.

The display area DA may have a quadrilateral shape on a plane defined by a first direction DR1 and a second direction DR2 perpendicular to the first direction DR1, and the corners of the display area DA may be rounded. However, the present disclosure is not limited thereto, and they may be angled.

As shown in FIG. 1, the first peripheral area may include a left first peripheral area adjacent to the left side of the display area DA, a right first peripheral area adjacent to the right side of the display area DA, an upper first peripheral area adjacent to the upper side of the display area DA, and a lower first peripheral area adjacent to the lower side of the display area DA.

The width of the second peripheral area may be smaller than the width of the first peripheral area. The second peripheral area may be connected to the lower first peripheral area.

The bending area BA may be a portion where the display device is folded.

The above-described drive integrated circuit D_IC may be connected to the first pad area PA1. The drive integrated circuit D_IC may be provided in the form of a drive chip. A plurality of first pads connected to the drive integrated circuit D_IC may be disposed in the first pad area PA1.

The printed circuit film FPC including a timing controller may be connected to the second pad area PA2. A plurality of second pads connected to the printed circuit film FPC may be disposed in the second pad area PA2.

On the other hand, the areas of the display device according to one embodiment are divided into the display area DA and the non-display area NDA, but they may be divided into a main area MA, a sub-area SA, and the bending area BA depending on the bent shape of the display device.

The main area MA may include the display area DA, the first peripheral area around the display area DA, and the area between the lower first peripheral area and the bending area BA in the second peripheral area. The sub-area SA may include the area located on the other side in the second direction DR2 with respect to the bending area BA in the second peripheral area.

Figure 2:
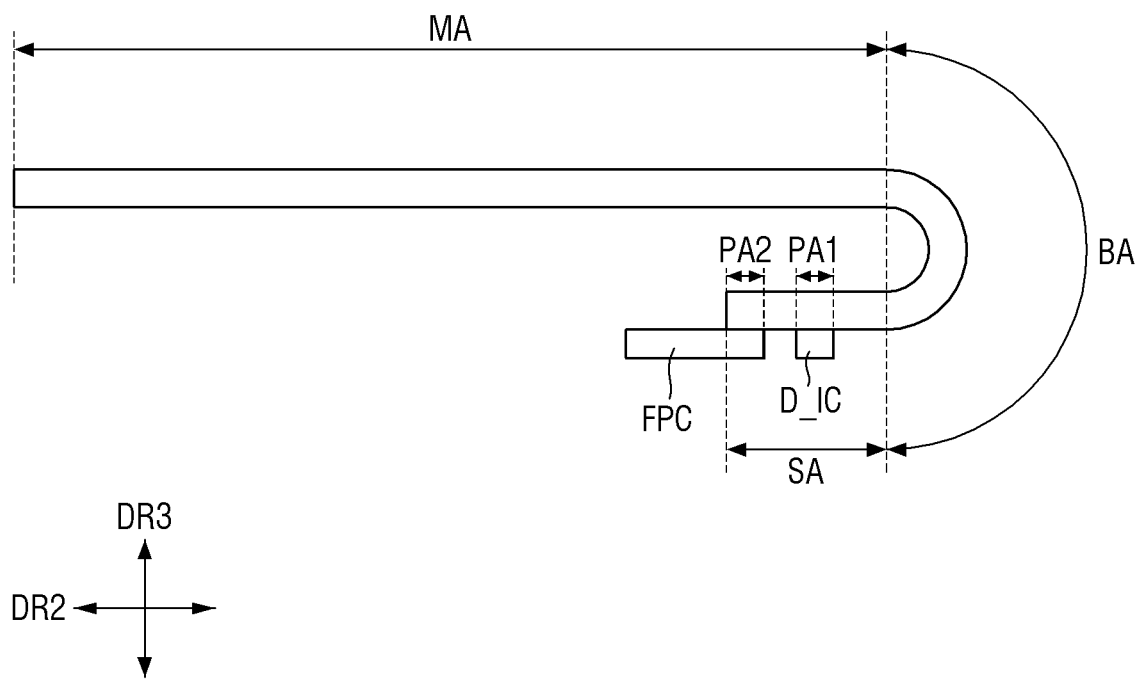
FIG. 2 is a schematic cross-sectional view of a display device according to one embodiment.

FIG. 2 is a schematic cross-sectional view of a display device according to one embodiment. FIG. 2 shows a cross-sectional view in which the display device according to one embodiment is bent with respect to the bending area BA.

Referring to FIGS. 1 and 2, the main area MA of the display device according to one embodiment may overlap the sub-area SA in a thickness direction. The display device according to one embodiment may include a display panel. Examples of the display panel may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and the like. In the following, a case where an organic light emitting display panel is applied as the display panel will be exemplified, but the present disclosure is not limited thereto, and other display panels may be applied within the same scope of the technical spirit.

As shown in FIG. 2, the bottom surface of the main area MA of the display panel according to one embodiment may be opposed to the bottom surface of the sub-area SA of the display panel, the top surface of the main area MA of the display panel may face one side in a third direction DR3, and the top surface of the sub-area SA of the display panel may face the other side in the third direction DR3.

Figure 3:
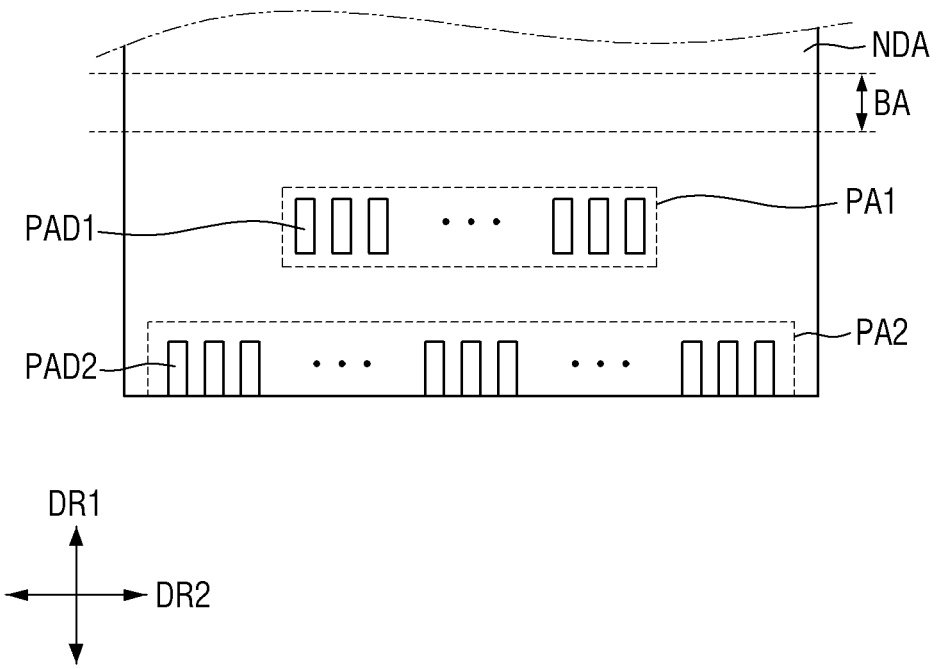
FIG. 3 is a plan view showing pads located in a first pad area and a second pad area of FIG. 1.

FIG. 3 is a plan view showing pads located in a first pad area and a second pad area of FIG. 1.

Referring to FIG. 3, the first pad area PA1 may include a plurality of first pads PAD1 and the second pad area PA2 may include a plurality of second pads PAD2. The pads PAD1 and PAD2 may be arranged along the second direction DR2. The first pads PAD1 may be connected to the drive integrated circuit D_IC (see FIG. 1), and the second pads PAD2 may be connected to the printed circuit film FPC (see FIG. 1).

Figure 4:
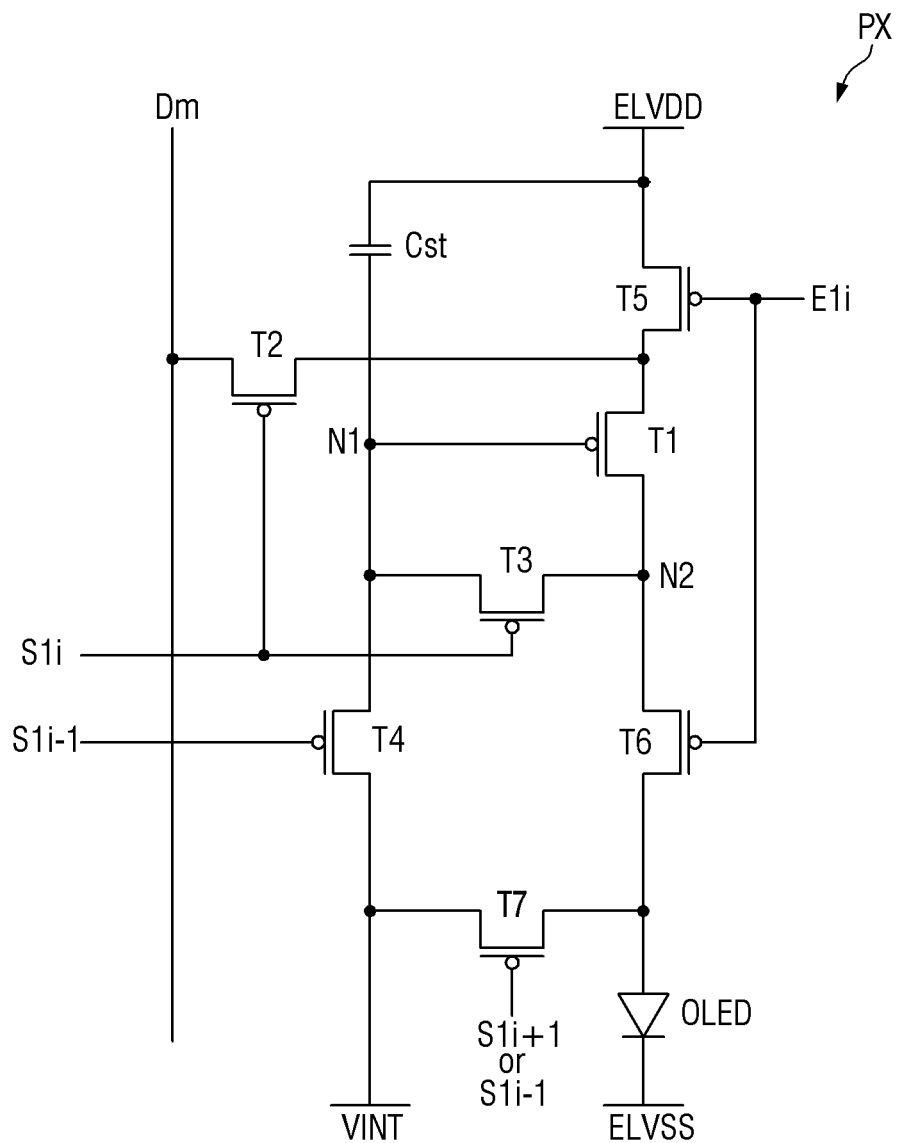
FIG. 4 is a diagram showing an embodiment of a pixel shown in FIG. 1.

FIG. 4 is a diagram showing an embodiment of a pixel shown in FIG. 1.

Referring to FIG. 4, the pixel PX connected to an $m^{th}$ data line Dm and an $i^{th}$ first scan line S1$i$ is illustrated for simplicity of description.

The pixel PX according to the embodiment of the present disclosure may include an organic light emitting diode OLED, first to seventh transistors T1 to T7, and a storage capacitor Cst.

The anode (or anode electrode) of the organic light emitting diode OLED may be connected to the first transistor T1 through the sixth transistor T6, and the cathode (or cathode electrode) of the organic light emitting diode OLED may be connected to the second power source ELVSS. This organic light emitting diode OLED may generate light having a predetermined luminance corresponding to the amount of current supplied from the first transistor T1.

The first power source ELVDD may be set to a higher voltage than the second power source ELVSS so that a current may flow toward the organic light emitting diode OLED.

The seventh transistor T7 may be connected between an initialization power supply Vint and the anode of the organic light emitting diode OLED. Then, the gate electrode of the seventh transistor T7 may be connected to an $(i+1)^{th}$ first scan line S1$i$+1 or an $(i-1)^{th}$ first scan line S1$i$−1. When the scan signal is supplied to the $i^{th}$ first scan line S1$i$, the seventh transistor T7 may be turned on to supply the voltage of the initialization power supply Vint to the anode of the organic light emitting diode OLED. Here, the initialization power supply Vint may be set to a lower voltage than the data signal.

The sixth transistor T6 is connected between the first transistor T1 and the organic light emitting diode OLED. Further, the gate electrode of the sixth transistor T6 may be connected to an $i^{th}$ first light emission control line Eli. The sixth transistor T6 may be turned off when the light emission control signal is supplied to the $i^{th}$ first light emission control line Eli and turned on in other cases.

The fifth transistor T5 may be connected between the first power supply ELVDD and the first transistor T1. Then, the gate electrode of the fifth transistor T5 may be connected to the $i^{th}$ first light emission control line Eli. The fifth transistor T5 may be turned off when the light emission control signal is supplied to the $i^{th}$ first light emission control line Eli and turned on in other cases.

The first electrode of the first transistor T1 (driving transistor) may be connected to the first power supply ELVDD through the fifth transistor T5, and the second electrode of the first transistor T1 may be connected to the anode of the organic light emitting diode OLED through the sixth transistor T6. Further, the gate electrode of the first transistor T1 may be connected to a first node N1. The first transistor T1 may control the amount of current flowing from the first power supply ELVDD to the second power supply ELVSS through the organic light emitting diode OLED in response to the voltage of the first node N1.

The third transistor T3 may be connected between the second electrode of the first transistor T1 and the first node N1. Then, the gate electrode of the third transistor T3 may be connected to the $i^{th}$ first scan line S1$i$. When the scan signal is supplied to the $i^{th}$ first scan line S1$i$, the third transistor T3 may be turned on to electrically connect the second electrode of the first transistor T1 to the first node N1. Therefore, when the third transistor T3 is turned on, the first transistor T1 may be connected in the form of a diode.

The fourth transistor T4 may be connected between the first node N1 and the initialization power supply Vint. Further, the gate electrode of the fourth transistor T4 may be connected to the (i−1)$^{th}$ first scan line S1i−1. When the scan signal is supplied to the (i−1)$^{th}$ first scan line S1i-1, the fourth transistor T4 may be turned on to supply the voltage of the initialization power supply Vint to the first node N1.

The second transistor T2 may be connected between the m$^{th}$ data line Dm and the first electrode of the first transistor T1. Further, the gate electrode of the second transistor T2 may be connected to the i$^{th}$ first scan line S1i. When the scan signal is supplied to the i$^{th}$ first scan line S1i, the second transistor T2 may be turned on to electrically connect the m$^{th}$ data line Dm to the first electrode of the first transistor T1.

The storage capacitor Cst may be connected between the first power supply ELVDD and the first node N1. The storage capacitor Cst may store the data signal and the voltage corresponding to the threshold voltage of the first transistor T1.

Figure 5:
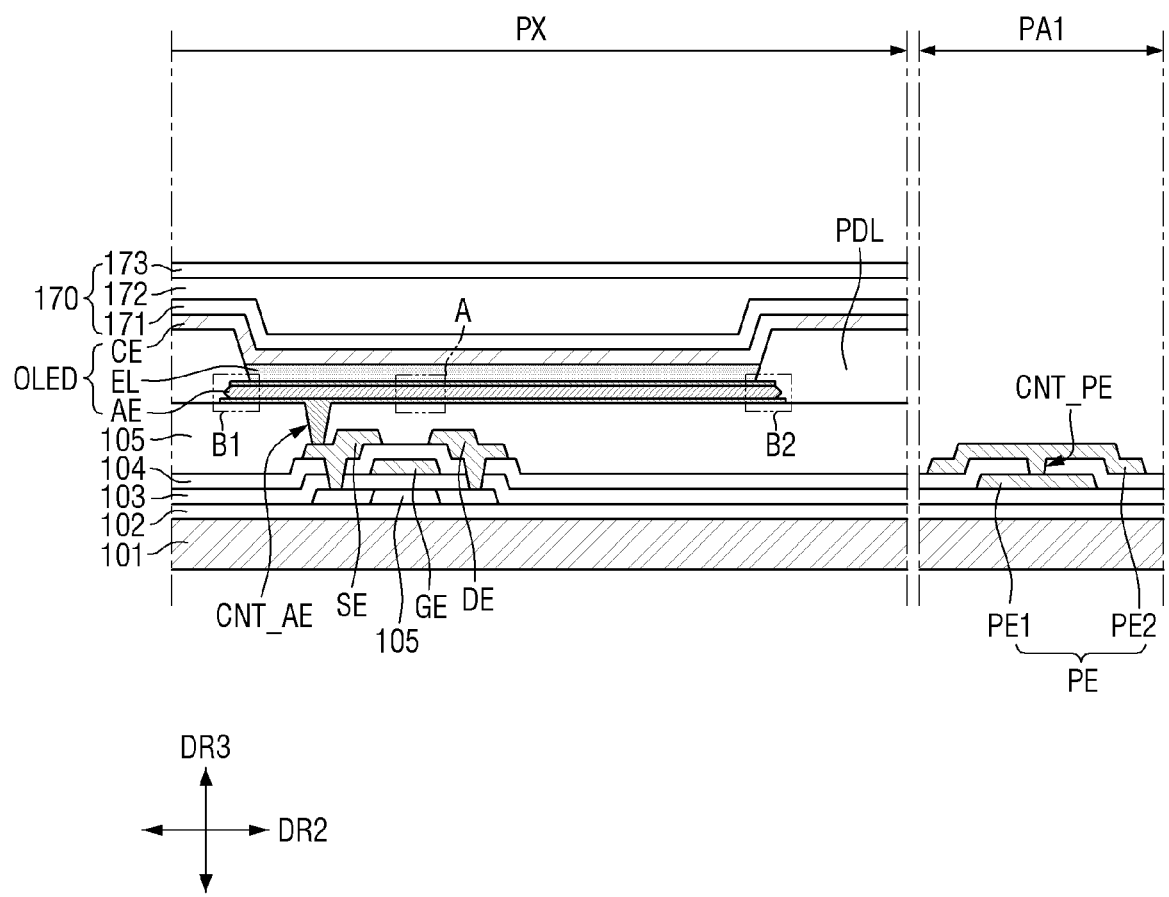
FIG. 5 is a cross-sectional view of a pixel and a first pad area of FIG. 1.

FIG. 5 is a cross-sectional view of a pixel and a first pad area of FIG. 1.

Referring to FIG. 5, the display device according to one embodiment may include a base substrate 101, a buffer layer 102, an active layer 105, a first gate insulating layer 103, a first gate conductive layer including a gate electrode GE and a first pad electrode PE1, an interlayer insulating layer 104, a data conductive layer including a source electrode SE, a drain electrode DE, and a second pad electrode PE2, a via layer 105, an organic light emitting diode OLED, a pixel defining layer PDL, and a thin film encapsulation layer 170.

The buffer layer 102, the active layer 105, the first gate insulating layer 103, the first gate conductive layer including the gate electrode GE and the first pad electrode PE1, the interlayer insulating layer 104, the data conductive layer including the source electrode SE, the drain electrode DE, and the second pad electrode PE2 may form a circuit element layer. The pixel defining layer PDL and the organic light emitting diode OLED may form a light emitting element layer.

The base substrate 101 may include a transparent insulating substrate. For example, the base substrate 101 may be a flexible transparent resin substrate. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, or the like. Preferably, the base substrate 101 may be a polyimide (PI) resin film.

The buffer layer 102 may prevent a phenomenon that metal atoms or impurities are diffused from the base substrate 101, and may control a heat transfer rate in a crystallization process for forming the active layer 105 to be described later to obtain a substantially uniform active layer 105. Further, when the surface of the base substrate 101 is not uniform, the buffer layer 102 may serve to improve flatness of the surface of the base substrate 101. The buffer layer 102 may be formed using a silicon compound such as silicon oxide (SiOx), silicon nitride (SiNx), silicon oxynitride (SiOxNy), silicon oxycarbide (SiOxCy), and silicon carbonitride (SiCxNy).

Although not shown, the buffer layer 102 may not be formed in the bending area BA. In other words, the buffer layer 102 may not be formed in the bending area BA or may be removed. This is because the bending area BA is a folded portion in a final product and, thus, damage such as cracks or the like may occur in the buffer layer 102 when the buffer layer 102 that is an inorganic layer is formed in the bending area BA. Similarly, the insulating layers 103, 104 and the like that are inorganic layers may not be formed in the bending area BA.

The active layer 105 may be disposed on the buffer layer 102. The active layer 105 may include a drain region and a source region that are doped with impurities, and a channel region disposed between the drain region and the source region.

The first gate insulating layer 103 may be disposed on the buffer layer 102 on which the active layer 105 is disposed. The first gate insulating layer 103 may include a silicon compound, a metal oxide, or the like.

The first gate conductive layer may be disposed on the gate insulating layer 120. The first gate conductive layer may include the gate electrode GE of the thin film transistor, a signal line such as a gate line for transmitting a signal for driving a pixel, the first pad electrode PE1, and the like. The first gate conductive layer may be made of a metal, an alloy, metal nitride, conductive metal oxide, a transparent conductive material, or the like. For example, the first gate conductive layer may be made of a metal such as copper, aluminum, molybdenum, or the like. Further, the first gate conductive layer may have a layered structure of multiple layers. For example, the first gate conductive layer may include a copper layer and a molybdenum layer disposed on the copper layer.

The interlayer insulating layer 104 may be disposed on the first gate conductive layer. The interlayer insulating layer 104 may be formed using a silicon compound such as silicon oxide (SiOx), silicon nitride (SiNx), silicon oxynitride (SiOxNy), silicon oxycarbide (SiOxCy), and silicon carbonitride (SiCxNy).

The data conductive layer may be disposed on the interlayer insulating layer 104. The data conductive layer may include the source electrode SE, the drain electrode DE, and the second pad electrode PE2.

The source electrode SE may be connected to the source region through the contact hole penetrating the interlayer insulating layer 104 and the first gate insulating layer 103. The drain electrode DE may be connected to the drain region through the contact hole penetrating the interlayer insulating layer 104 and the first gate insulating layer 103. The second pad electrode PE2 may be connected to the first pad electrode PE1 through the contact hole penetrating the interlayer insulating layer 104.

The data conductive layer may be made of a metal, an alloy, metal nitride, conductive metal oxide, a transparent conductive material, or the like. For example, the data conductive layer may be made of a metal such as copper or aluminum having high conductivity. The data conductive layer may have a layered structure of multiple layers. For example, the data conductive layer may include a titanium layer, an aluminum layer on the titanium layer, and a titanium layer on the aluminum layer.

The via layer 105 may be disposed on the interlayer insulating layer 104 on which the data conductive layer is disposed. The via layer 105 may contain an organic insulating material, and may have a substantially flat top surface while sufficiently covering the data conductive layer.

The organic light emitting diode OLED may include a first electrode AE (or anode electrode), an organic light emitting layer EL, and a second electrode CE (or cathode electrode).

The anode electrode AE may be disposed on the via layer 105. The anode electrode AE may be electrically connected to the source electrode SE through contact holes CNT_AE formed through the via layer 105.

The anode electrode AE may be formed using a reflective material or a light transmitting material. For example, the anode electrode AE may contain aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These may be used alone or in combination with each other. In exemplary embodiments, the anode electrode AE may have a single layer structure or a multi-layer structure including a metal layer, an alloy layer, a metal nitride layer, a conductive metal oxide layer or a transparent conductive material layer.

Hereinafter, the anode electrode AE according to one embodiment will be described in more detail.

Figure 6:
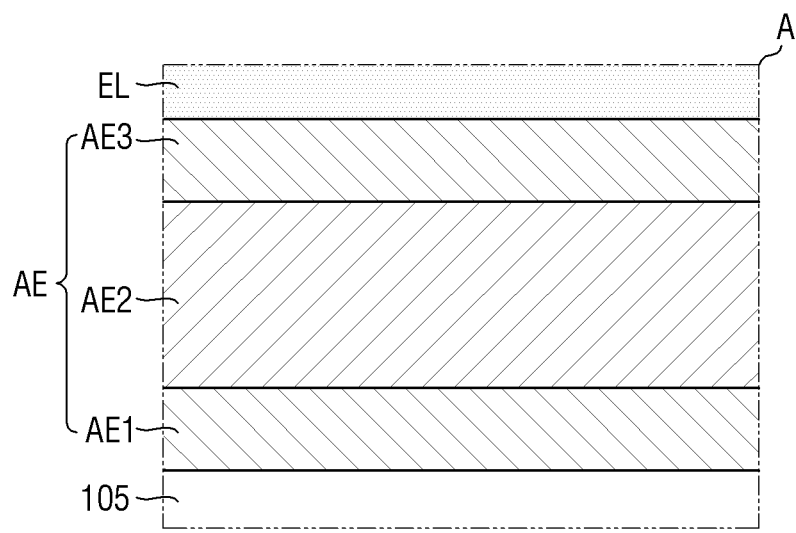
FIG. 6 is an enlarged view of area A of FIG. 5.
Figure 7:
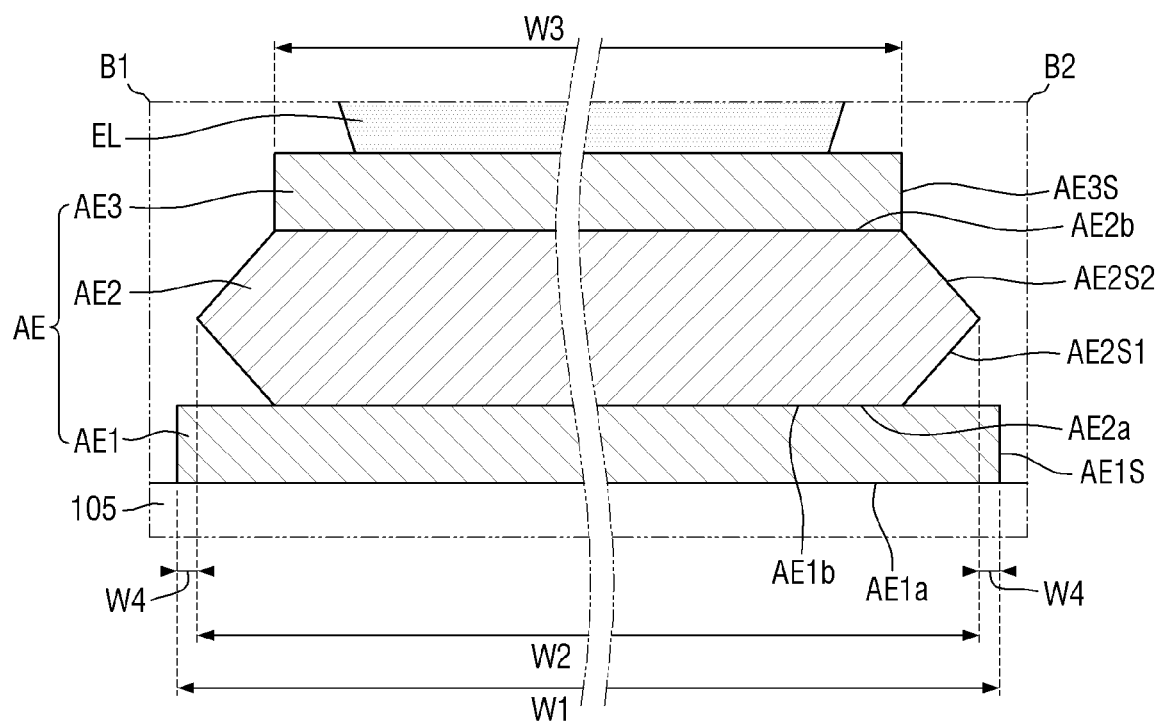
FIG. 7 is an enlarged view of areas B1 and B2 of FIG. 5.

FIG. 6 is an enlarged view of area A of FIG. 5. FIG. 7 is an enlarged view of areas B1 and B2 of FIG. 5.

Referring to FIGS. 6 and 7 together with FIG. 5, in one embodiment, the anode electrode AE may include a first anode electrode AE1 disposed on the via layer 105, a second anode electrode AE2 disposed between the first anode electrode AE1 and the organic light emitting layer EL, and a third anode electrode AE3 disposed between the second anode electrode AE2 and the organic light emitting layer EL. The first anode electrode AE1 may be disposed between the via layer 105 and the second anode electrode AE2.

In other words, a bottom surface AE1a of the first anode electrode AE1 may be in direct contact with the via layer 105, and a top surface AE1b of the first anode electrode AE1 may be in direct contact with a bottom surface AE2a of the second anode electrode AE2. The top surface AE2b of the second anode electrode AE2 may be in direct contact with the third anode electrode AE3.

The material of the first anode electrode AE1 and the material of the third anode electrode AE3 may be selected from the above-described materials of the anode electrode AE, and may be different from each other. In one embodiment, the material of the first anode electrode AE1 may include Indium-Zinc-Oxide (IZO), and the material of the third anode electrode AE3 may include Indium-Tin-Oxide (ITO).

The material of the second anode electrode AE2 may include a reflective metal. In one embodiment the material of the second anode electrode AE2 may include silver (Ag).

The first anode electrode AE1 may have a function of increasing the adhesive force between the anode electrode and the via layer. The third anode electrode AE3 may have a high work function compared to the second anode electrode AE2 and have a function of preventing aggregation of the second anode electrode AE2.

In one embodiment, the material of the first anode electrode AE1 may have an alloy ratio in which a relative ratio of indium to zinc (In:Zn) is 9:1 to 8:2.

The first anode electrode AE1 may have an etching rate of 1.25 Å/sec to 2.5 Å/sec with respect to a non-phosphoric acid-based etchant.

The first anode electrode AE1 and the second anode electrode AE2 may be etched in a continuous process using the non-phosphoric acid-based etchant. On the other hand, the third anode electrode AE3 may be etched by a process different from that of the first anode electrode AE1 and the second anode electrode AE2. In other words, after the third anode electrode AE3 is first formed by etching, the first anode electrode AE1 and the second anode electrode AE2 may be etched in a continuous process using the same non-phosphoric acid-based etchant.

For example, the etching of the first anode electrode AE1 and the second anode electrode AE2 with respect to the non-phosphoric acid-based etchant may be completed within 60 seconds.

In accordance with the present embodiment, since the first anode electrode AE1 and the second anode electrode AE2 of the anode electrode AE are etched in a continuous process using the same non-phosphoric acid-based etchant, it is possible to omit one etching step compared to the case of forming the third anode electrode AE3, the second anode electrode AE2, and the first anode electrode AE1 by different etching steps, which is advantageous in that the process can be simplified.

The shapes of the first anode electrode AE1, the second anode electrode AE2, and the third anode electrode AE3 according to one embodiment may be determined by the characteristics that the first anode electrode AE1 has an etching rate of 1.25 Å/sec to 2.5 Å/sec with respect to the non-phosphoric acid-based etchant and the characteristics that the first anode electrode AE1 and the second anode electrode AE2 are etched in a continuous process by the non-phosphoric acid-based etchant.

The first anode electrode AE1, the second anode electrode AE2, and the third anode electrode AE3 that are stacked may have different widths. For example, the first anode electrode AE1 may have a first width W1, the second anode electrode AE2 may have a second width W2, and the third anode electrode AE3 may have a third width W3. In one embodiment, the first width W1 may be greater than the second width W2 and the third width W3, and the second width W2 may be greater than the third width W3.

In one embodiment, the end of the first anode electrode AE1 may be aligned with the end of the second anode electrode AE2 in the thickness direction, or may protrude outward.

The first anode electrode AE1 may have a first side surface AE1S, and the second anode electrode AE2 may have a second side surface including a second upper side surface AE2S2 connected to the top surface AE2b of the second anode electrode AE2 and a second lower side surface AE2S1 connected to the bottom surface AE2a of the second anode electrode AE2. The first side surface AE1S may be aligned with the intersection of the second upper side surface AE2S2 and the second lower side surface AE2S, or may protrude outward.

The end of the first anode electrode AE1 may protrude from the end of the second anode electrode AE2 by a predetermined separation distance W4. For example, the end of the first anode electrode AE1 may protrude outward from the end of the second anode electrode AE2 by 0 to 0.05 μm.

In the present embodiment, as described above, the first anode electrode AE1 has a function of increasing the adhesive force between the anode electrode and the via layer, and the adhesive force between the anode electrode AE and the via layer 105 is advantageously improved because the end of the first anode electrode AE1 protrudes outward from the end of the second anode electrode AE2 by 0 to 0.05 μm.

Referring back to FIG. 5 showing the stacked structure of the pixel PX according to one embodiment, the pixel defining layer PDL may be disposed on the via layer 105 where the anode electrode AE is located. The pixel defining layer PDL may be made of an organic material, an inorganic material, or the like. For example, the pixel defining layer PDL may be made of a photoresist, a polyacrylic resin, a polyimide-based resin, an acrylic resin, a silicon compound, or the like. In accordance with exemplary embodiments, the pixel defining layer PDL may be etched to form an opening that partially exposes the anode electrode AE.

The organic light emitting layer EL may be disposed on the anode electrode AE exposed through the opening of the pixel defining layer PDL. Further, the organic light emitting layer EL may extend on the sidewall of the opening of the pixel defining layer PDL. In exemplary embodiments, the organic light emitting layer EL may have a multilayer structure including an organic layer, a hole injecting layer, a hole transporting layer, an electron transporting layer, an electron injecting layer, and the like.

In another embodiment, the hole injecting layer, the hole transporting layer, the electron transporting layer, and the electron injecting layer except the organic light emitting layer may be commonly formed to correspond to a plurality of pixels PX.

The organic layer of the organic light emitting layer EL may be made of light emitting materials capable of generating different color lights such as red light, green light, blue light, and the like depending on the pixels PX of the display device. In accordance with other exemplary embodiments, the organic layer of the organic light emitting layer EL may have a structure in which a plurality of light emitting materials capable of implementing different color lights such as red light, green light, blue light, and the like are stacked to emit white light. At this time, the light emitting structures may be commonly formed to correspond to a plurality of pixels PX, and the pixels may be distinguished by the color filter layer.

The second electrode CE (or cathode electrode) may be disposed on the pixel defining layer PDL and the organic light emitting layer EL. Depending on the light emitting method of the display device, the second electrode CE may contain a light transmitting material or a reflective material. For example, the second electrode CE may contain aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These may be used alone or in combination with each other. In exemplary embodiments, the second electrode CE may have a single layer structure or a multilayer structure including a metal layer, an alloy layer, a metal nitride layer, a conductive metal oxide layer or a transparent conductive material layer.

The thin film encapsulation layer 170 may be disposed on the second electrode CE. The thin film encapsulation layer 170 may prevent the permeation of external moisture and oxygen. The thin film encapsulation layer 170 may include at least one organic layer and at least one inorganic layer. At least one organic layer 172 and one or more inorganic layers 171 and 173 may be stacked alternately. For example, the thin film encapsulation layer 170 may, but not necessarily, include two inorganic layers 171 and 173 and one organic layer 172 disposed therebetween. In another embodiment, an encapsulation substrate may be provided, instead of the thin film encapsulation layer 170, to prevent external air and moisture from permeating into the display device.

Hereinafter, a display device according to another embodiment will be described. In the following embodiments, the same components as those of the above-described embodiment are denoted by the same reference numerals, and a description thereof will be omitted or simplified.

Figure 8:
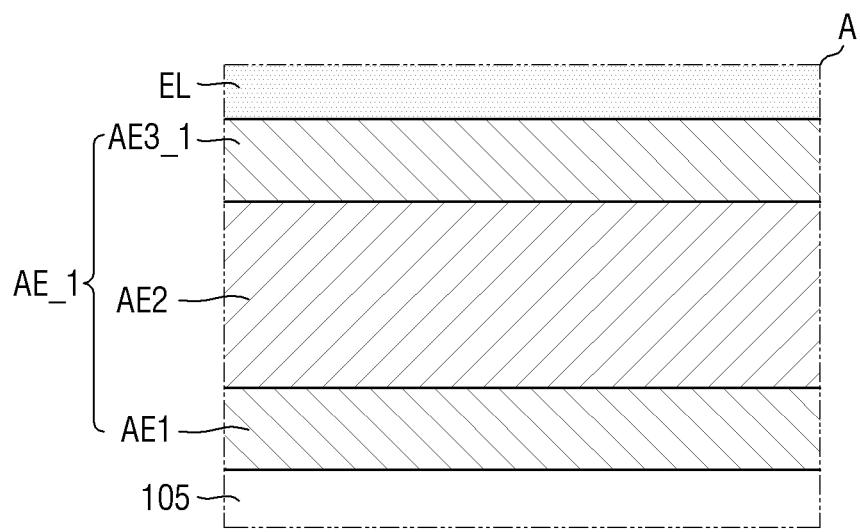
FIG. 8 is a cross-sectional view of an anode electrode according to another embodiment.

FIG. 8 is a cross-sectional view of an anode electrode according to another embodiment.

Referring to FIG. 8, an anode electrode AE_1 according to the present embodiment is different from the anode electrode AE of FIG. 6 in that a third anode electrode AE3_1 contains the same material as that of a first anode electrode AE1.

More specifically, in the anode electrode AE_1 according to the present embodiment, the third anode electrode AE3_1 may contain the same material as that of the first anode electrode AE1. In accordance with the present embodiment, the third anode electrode AE3_1, a second anode electrode AE2, and the first anode electrode AE1 of the anode electrode AE_1 may be etched in a continuous process using the same non-phosphoric acid-based etchant.

In accordance with the present embodiment, since the third anode electrode AE3_1, the second anode electrode AE2, and the first anode electrode AE1 of the anode electrode AE_1 are etched in a continuous process using the same non-phosphoric acid-based etchant, it is possible to omit one etching step compared to the case of forming the anode electrode AE according to one embodiment, which is advantageous in that the process can be simplified.

Hereinafter, a method of manufacturing a display device according to one embodiment will be described. In the following embodiments, the same components as those of the above-described embodiment are denoted by the same reference numerals, and a description thereof will be omitted or simplified.

FIGS. 9 to 17 are cross-sectional views showing the steps of a method of manufacturing a display device according to one embodiment.

Figure 9:
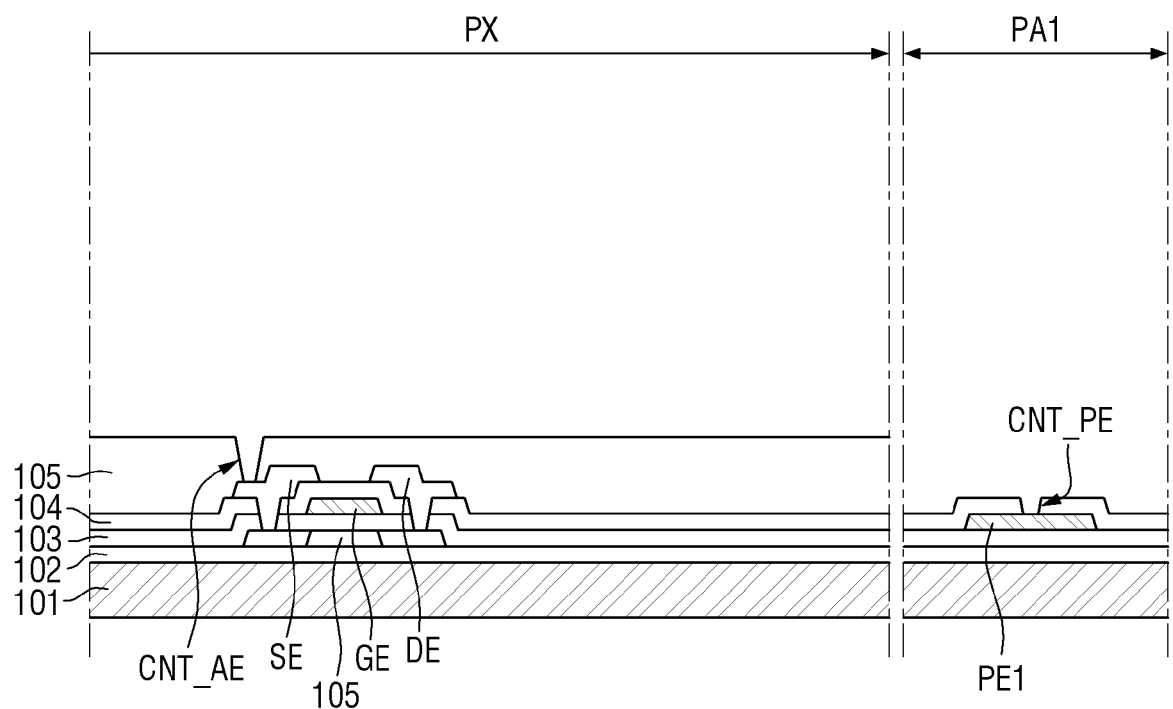
FIGS. 9, 10, 11, 12, 13, 14, 15, 16, and 17 are cross-sectional views showing the steps of a method of manufacturing a display device according to one embodiment.

Referring to FIGS. 5 and 9, first, a step of forming the active layer 105 on the display area DA of the base substrate 101 where the display area DA and the first pad area PA1 adjacent to the display area DA are defined is executed.

The base substrate 101 may include a transparent insulating substrate. For example, the base substrate 101 may be a flexible transparent resin substrate. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, or the like. Preferably, the base substrate 101 may be a polyimide (PI) resin film.

The active layer 105 may include a drain region and a source region that are doped with impurities, and a channel region disposed between the drain region and the source region.

Next, a step of forming the gate insulating layer 103 on the active layer 105 is executed.

The first gate insulating layer 103 may include a silicon compound, a metal oxide, or the like.

Next, as a step of forming, on the gate insulating layer 103, a first conductive layer including the gate electrode GE on the display area DA and the first pad electrode PE1 on the first pad area PA1 is executed.

The first conductive layer may be made of a metal, an alloy, metal nitride, conductive metal oxide, a transparent conductive material, or the like. For example, the first conductive layer may be made of a metal such as copper, aluminum, molybdenum, or the like. Further, the first conductive layer may have a layered structure of multiple layers.

Next, a step of forming the interlayer insulating layer 104 on the first conductive layer is executed.

The interlayer insulating layer 104 may be formed using a silicon compound such as silicon oxide (SiOx), silicon nitride (SiNx), silicon oxynitride (SiOxNy), silicon oxycarbide (SiOxCy), and silicon carbonitride (SiCxNy).

Next, as a step of forming, on the interlayer insulating layer 104, a second conductive layer including the source electrode SE and the drain electrode DE connected to the active layer 105 on the display area DA and the second pad electrode PE2 connected to the first pad electrode PE1 on the first pad area PA1 is executed.

The second conductive layer may be made of a metal, an alloy, metal nitride, conductive metal oxide, a transparent conductive material, or the like. For example, the second conductive layer may be made of a metal such as copper or aluminum having high conductivity. The second conductive layer may have a layered structure of multiple layers. For example, the second conductive layer may include a titanium layer, an aluminum layer on the titanium layer, and a titanium layer on the aluminum layer.

Referring to FIGS. 5 and 9, next, a step of forming the via layer 105 on the second conductive layer of the display area DA (but not the first pad area PA1) is executed. The via layer 105 may contain an organic insulating material, and may have a substantially flat top surface while sufficiently covering the second conductive layer.

Figure 10:
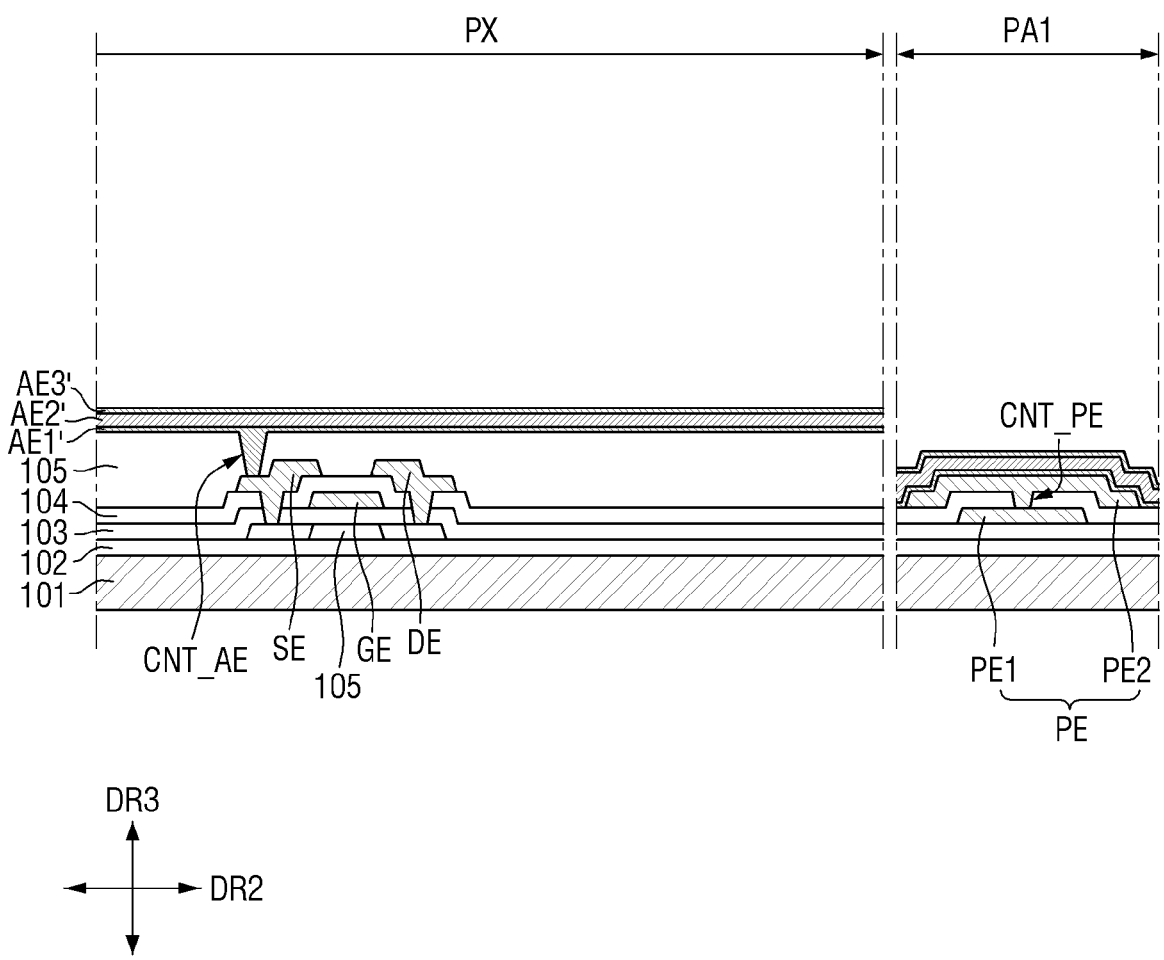

Referring to FIGS. 5 and 10, next, a step of forming a first anode electrode layer AE1' over the display area DA and the first pad area PA1 on the via layer 105 is executed.

Referring to FIGS. 5 and 10, next, a step of forming a second anode electrode layer AE2' over the display area DA and the first pad area PA1 on the first anode electrode layer AE1' is executed.

Referring to FIGS. 5 and 10, next, a step of forming a third anode electrode layer AE3' over the display area DA and the first pad area PA1 on the second anode electrode layer AE2' is executed.

In a method of manufacturing a display device according to one embodiment, the material of the first anode electrode layer AE1' and the material of the third anode electrode layer AE3' may be different. The material of the third anode electrode layer AE3' may include Indium-Tin-Oxide (ITO), and the material of the first anode electrode layer AE1' may include Indium-Zinc-Oxide (IZO).

The material of the second anode electrode layer AE2' may include a reflective metal. In one embodiment, the material of the second anode electrode layer AE2' may include silver (Ag).

Further, the material of the first anode electrode layer AE1' may have an alloy ratio in which a relative ratio of indium to zinc (In:Zn) is 9:1 to 8:2.

Figure 11:
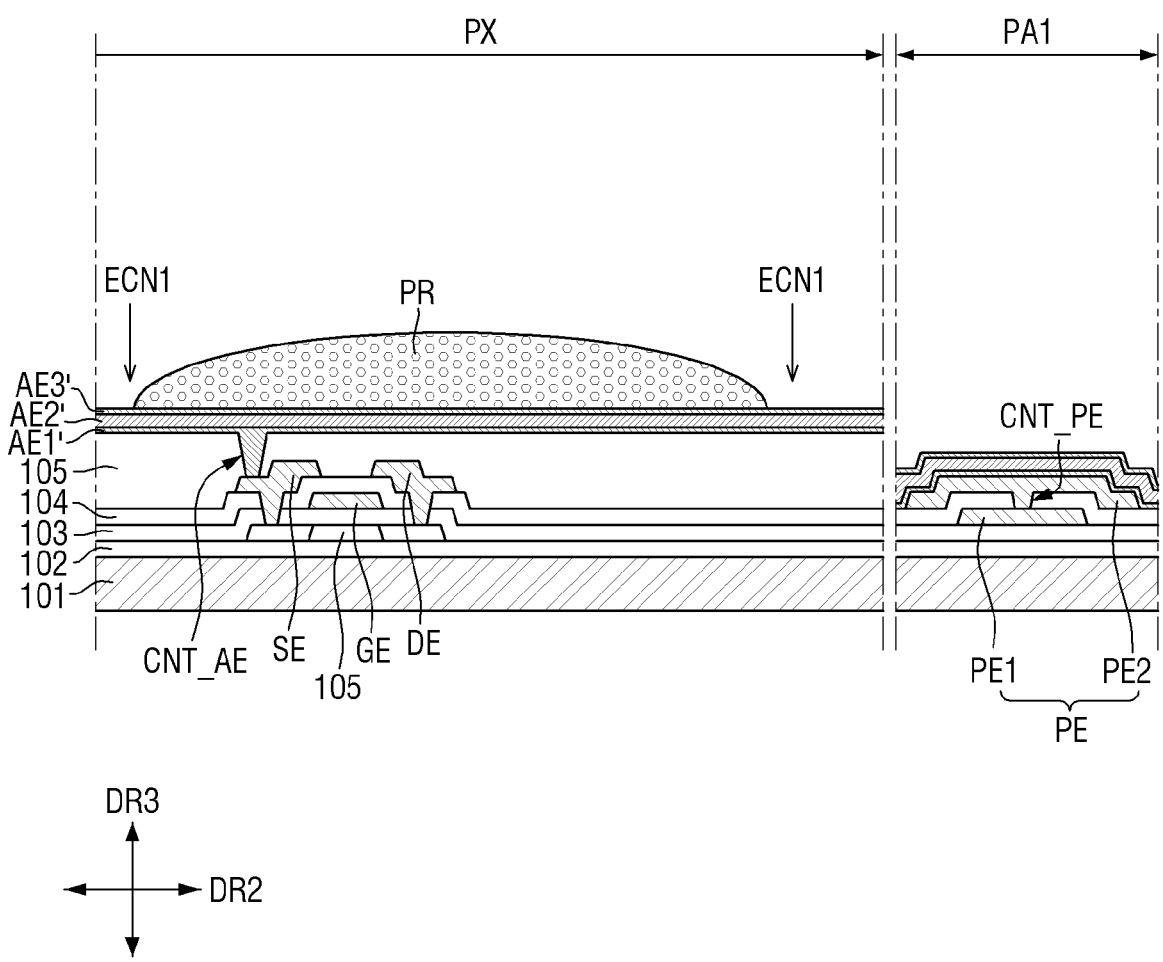

Referring to FIGS. 5 and 11, next, a step of arranging a photoresist PR on the third anode electrode layer AE3' in the display area DA is executed after the step of forming the third anode electrode layer AE3'.

Figure 12:
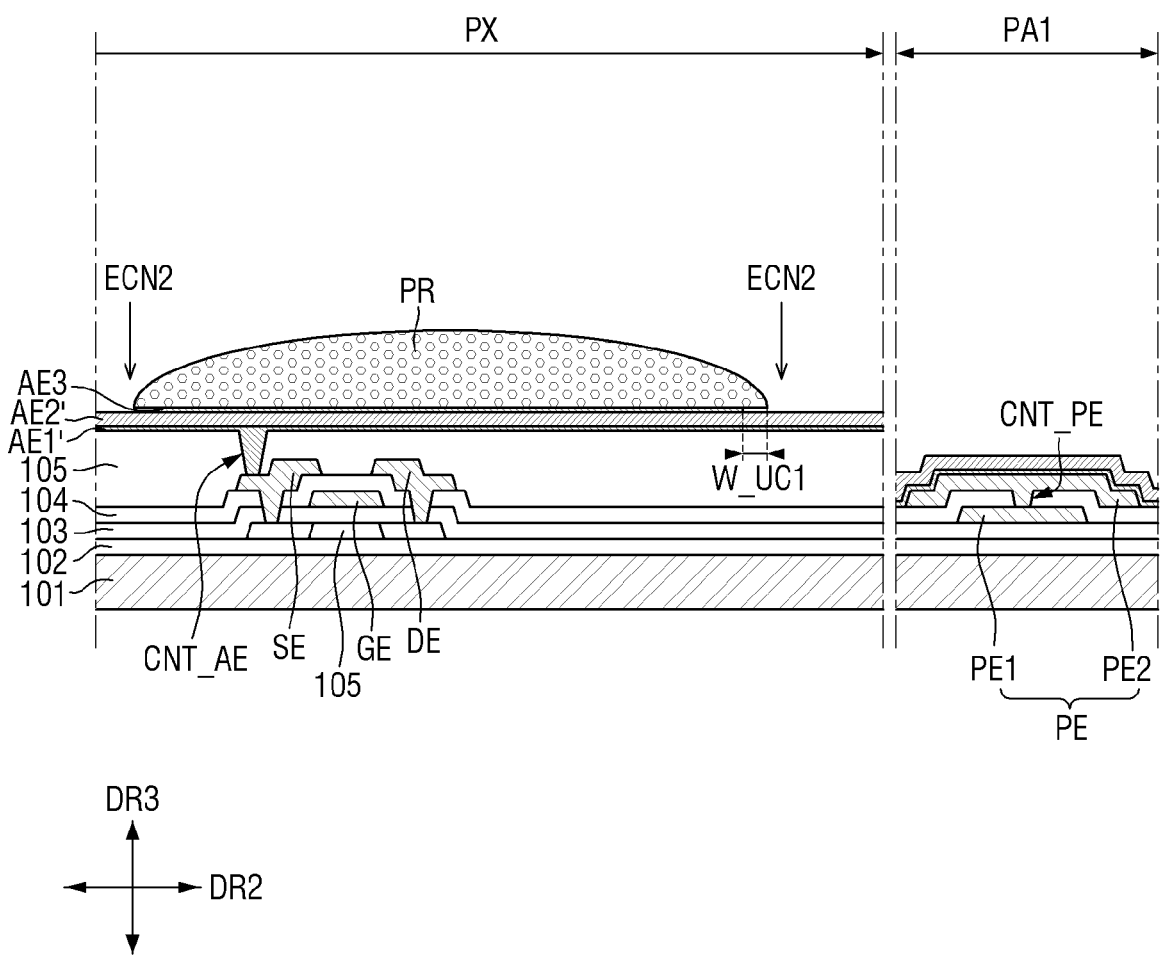

Referring to FIGS. 5 and 12, next, a step of forming the third anode electrode AE3 by etching the third anode electrode layer AE3' using a first etchant ECN1 while using the photoresist PR as a mask is executed after the step of arranging the photoresist. As shown in FIG. 12, the third anode electrode AE3 is formed to have a predetermined undercut length W_UC1 with respect to the photoresist PR. The first etchant ECN1 may include a phosphoric acid-based etchant. Accordingly, the other third anode electrode layer AE3' except the third anode electrode layer AE3' overlapping the photoresist PR is removed.

After the step of forming the third anode electrode AE3, a step of forming the second anode electrode AE2 by etching the second anode electrode layer AE2' using a second etchant ECN2 different from the first etchant ECN1 while using the photoresist PR as a mask is executed. The second etchant ECN2 may include a non-phosphoric acid-based etchant. Accordingly, the other second anode electrode layer AE2' except the second anode electrode layer AE2' overlapping the photoresist PR is removed.

In a method of manufacturing a display device according to one embodiment, a step of forming the first anode electrode AE1 by etching the first anode electrode layer AE1' using the second etchant ECN2 while using the photoresist PR as a mask is executed in a continuous process with the step of forming the second anode electrode AE2. Accordingly, the other first anode electrode layer AE1' except the first anode electrode layer AE1' overlapping the photoresist PR is removed.

The first anode electrode layer AE1' and the second anode electrode layer AE2' may be etched in a continuous process using the non-phosphoric acid-based etchant.

As described above, in a method of manufacturing a display device according to one embodiment, the material of the first anode electrode layer AE1' includes Indium-Zinc-Oxide (IZO), and the material of the first anode electrode layer AE1' has an alloy ratio in which a relative ratio of indium to zinc (In:Zn) is 9:1 to 8:2. Therefore, the first anode electrode layer AE1' has an etching rate of 1.25 Å/sec to 2.5 Å/sec with respect to the non-phosphoric acid-based etchant, and the etching in the step of forming the second anode electrode layer AE2' and the step of forming the first anode electrode layer AE1' may be completed within 60 seconds using the non-phosphoric acid-based etchant.

In other words, in accordance with the present embodiment, since the second anode electrode layer AE2' and the first anode electrode layer AE1' are etched in a continuous process using the same non-phosphoric acid-based etchant, it is possible to omit one etching step compared to the case of forming the third anode electrode layer AE3', the second anode electrode layer AE2', and the first anode electrode layer AE1' by different etching steps, which is advantageous in that the process can be simplified.

Further, when the second anode electrode layer AE2' is etched using the phosphoric acid-based etchant, the phosphoric acid-based etchant may etch the second conductive layer that is disposed below the first anode electrode layer AE1' and has an etching rate which is not small with respect to the phosphoric acid-based etchant. In this case, the material (e.g., silver particles) of the second anode electrode layer AE2' dissolved in the phosphoric acid-based etchant is deposited on the second conductive layer, which may cause a defect of the display device.

However, in the case of a method of manufacturing a display device according to one embodiment, since the second anode electrode layer AE2' is etched using the non-phosphoric acid-based etchant, it is possible to reduce the possibility that the second conductive layer is etched by the non-phosphoric acid-based etchant during the formation of the second anode electrode layer AE2' and the third anode electrode layer AE3'.

Figure 13:
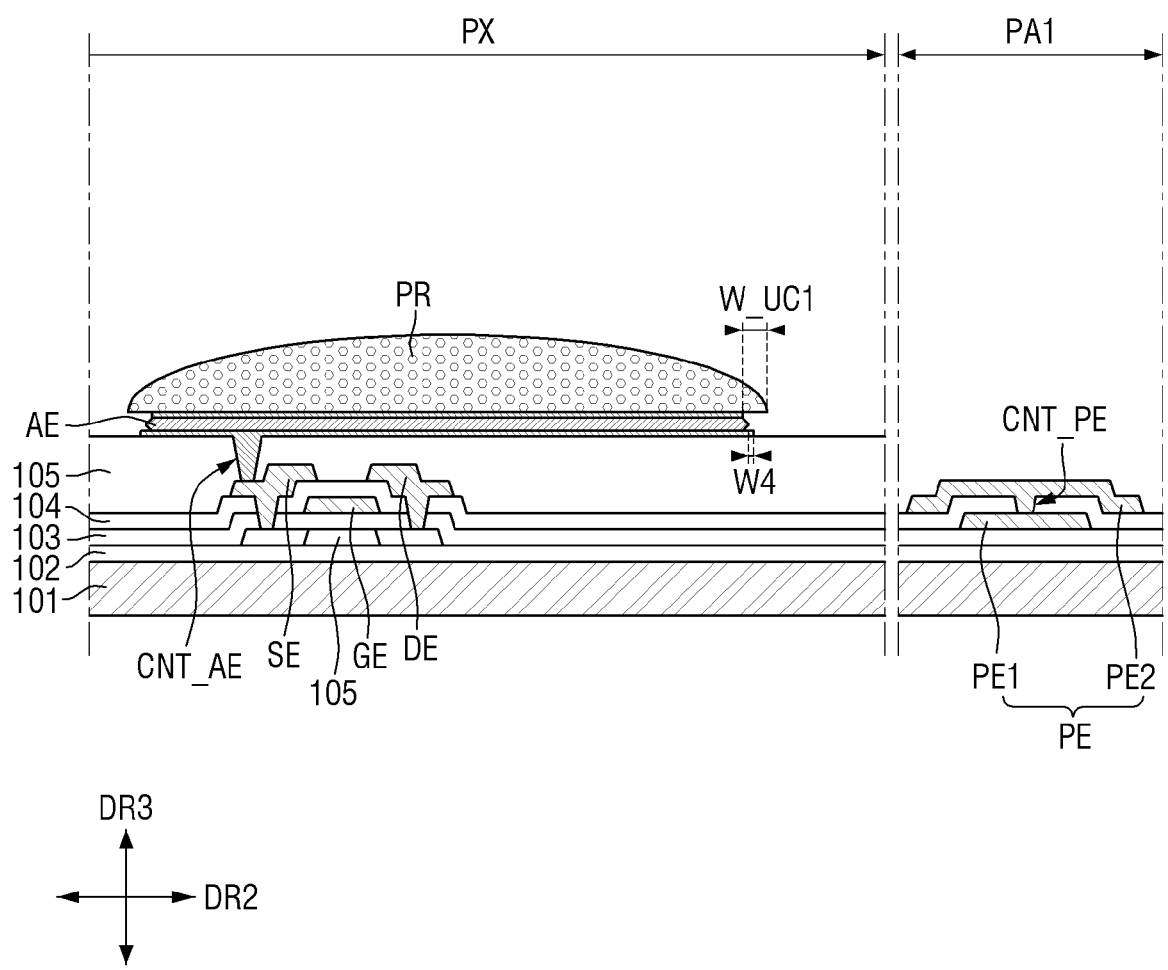

FIG. 13 illustrates an embodiment of the anode electrode AE (i.e. the first anode electrode AE1, the second anode electrode AE2, and the third anode electrode AE3 of FIG. 12) upon completing the etching process. The shapes of the first electrode AE1, the second electrode AE2, and the third anode electrode AE3 according to one embodiment described with reference to FIGS. 5 and 7 may be determined by the characteristics that the first anode electrode layer AE1' has an etching rate of 1.25 Å/sec to 2.5 Å/sec with respect to the non-phosphoric acid-based etchant and the characteristics that the first anode electrode layer AE1' and the second anode electrode layer AE2' are etched in a continuous process using the non-phosphoric acid-based etchant. Since the shapes of the anode electrodes AE1, AE2, and AE3 have been described above, the redundant description thereof will be omitted.

Figure 14:
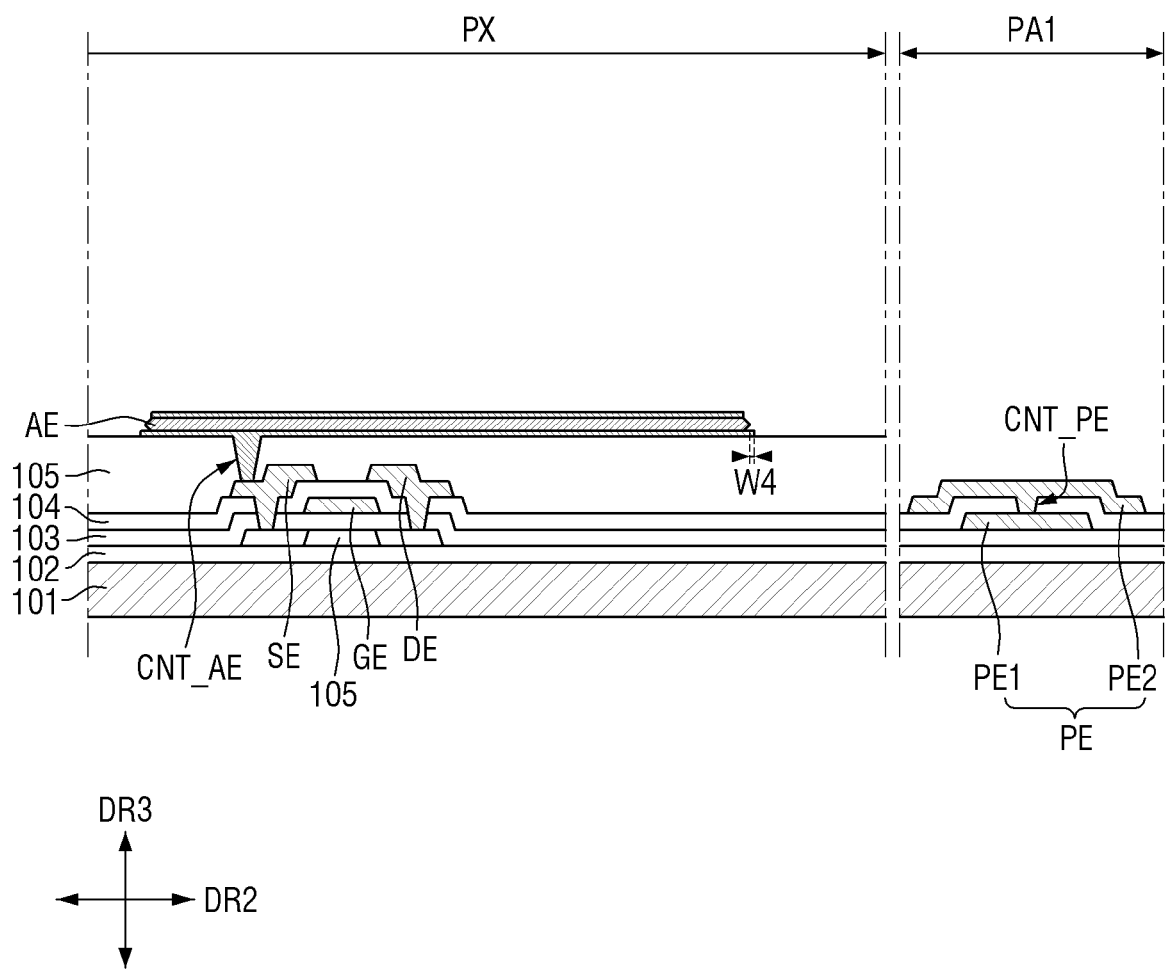

FIG. 14 illustrates an embodiment of the anode electrode AE following a step of removing the photoresist PR.

Figure 15:
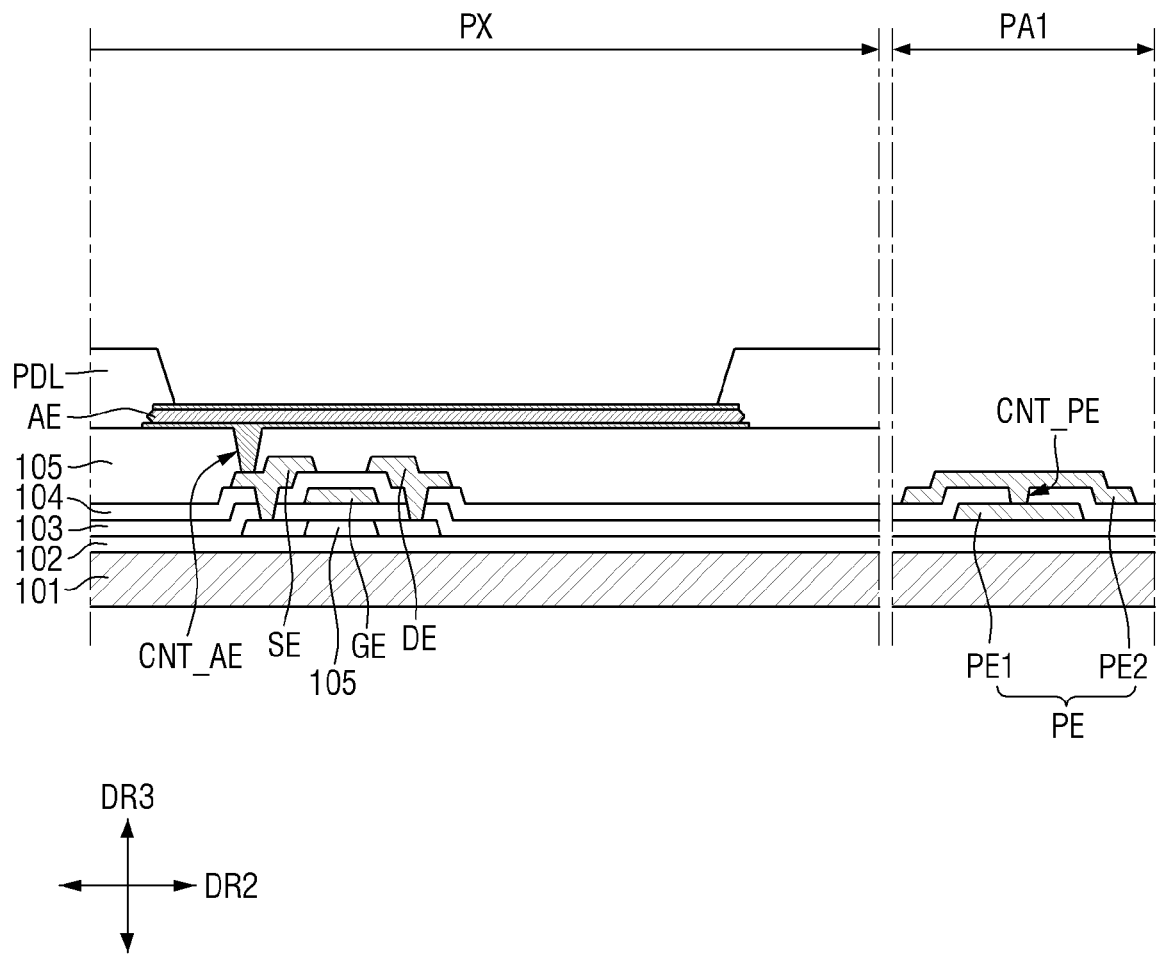

FIG. 15 illustrates an embodiment of the anode electrode AE and the pixel defining layer PDL after steps of depositing the pixel defining layer PDL and etching the opening in the pixel defining layer exposing the anode electrode AE.

Figure 16:
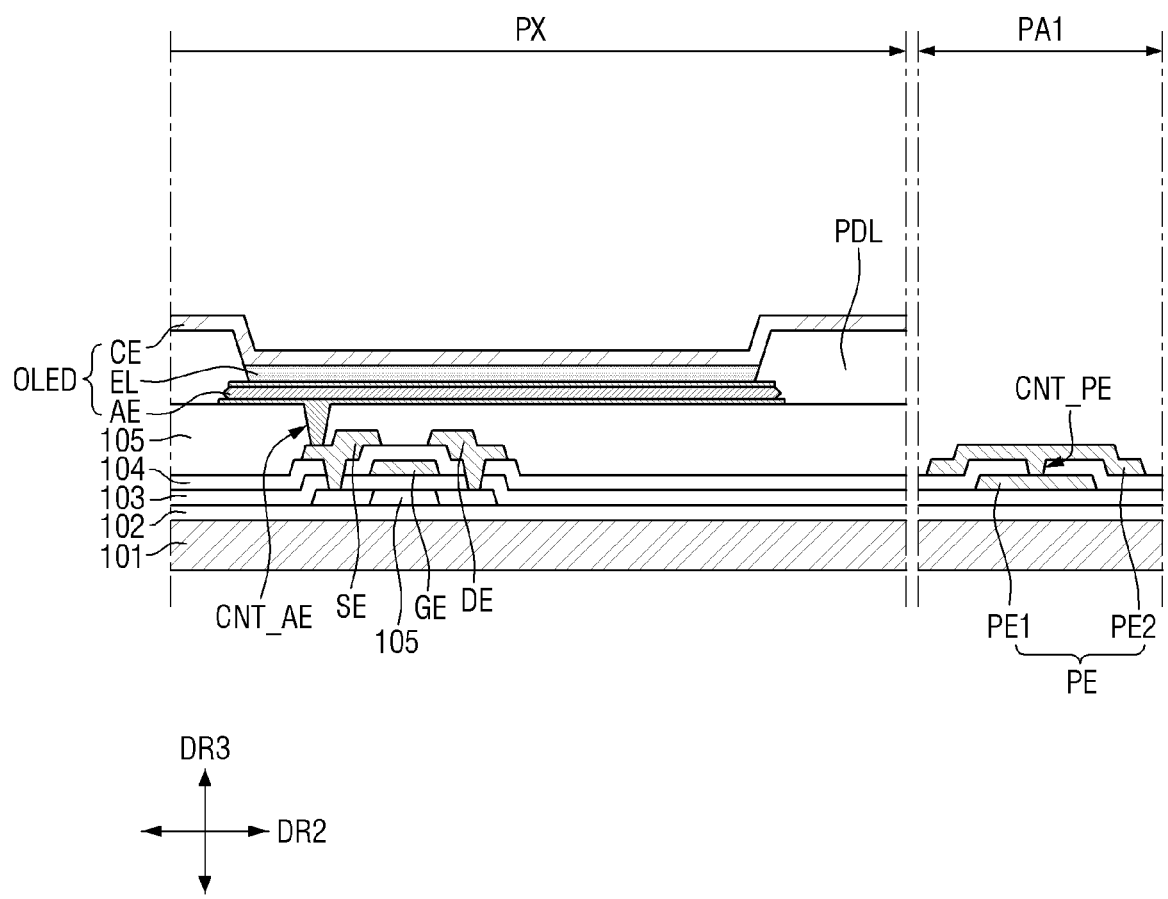

FIG. 16 illustrates an embodiment of the organic light emitting diode OLED after steps of depositing the organic light emitting layer EL and the cathode electrode CE.

Figure 17:
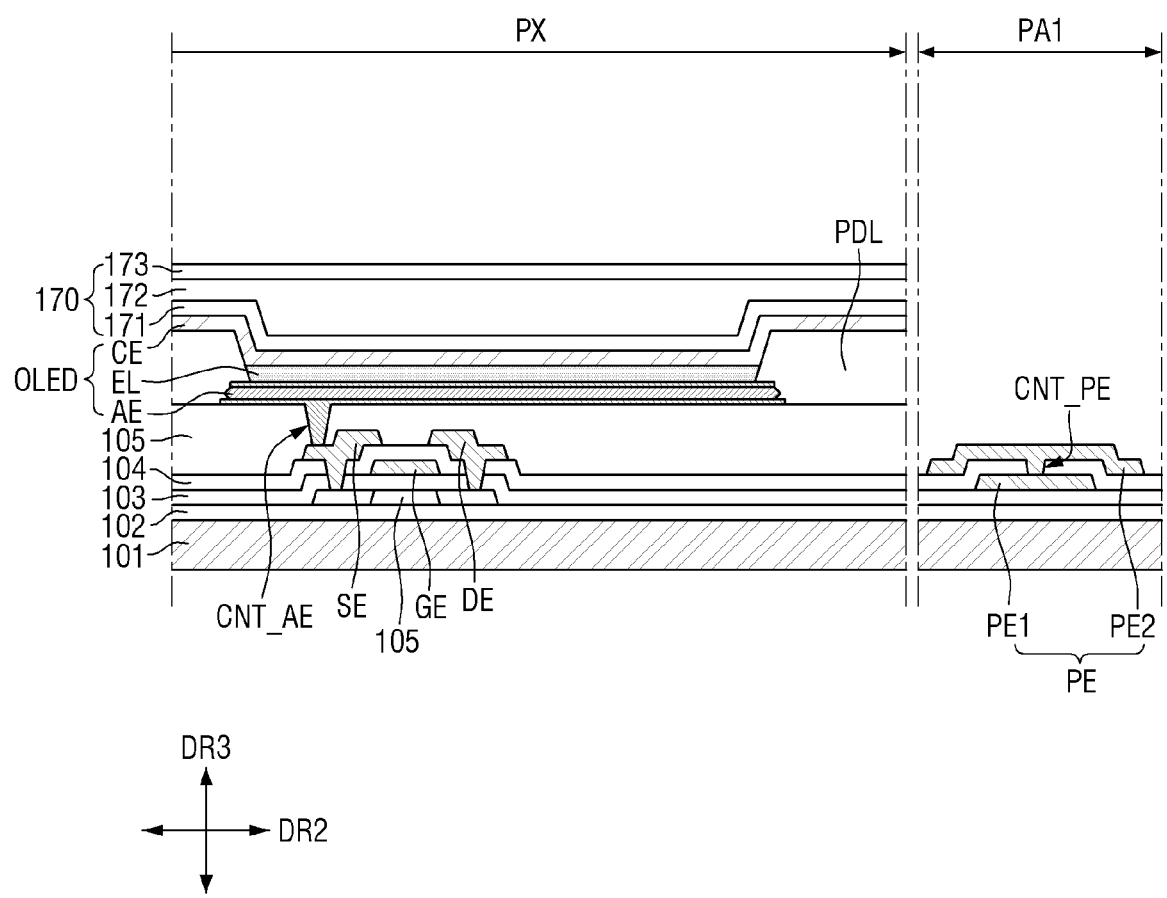

FIG. 17 illustrates an embodiment of the thin film encapsulation layer 170 after steps of depositing an inorganic layer 171, an organic layer 172, and another organic layer 173.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a base substrate;
an anode electrode disposed on the base substrate;
a cathode electrode facing the anode electrode; and
an organic light emitting layer disposed between the anode electrode and the cathode electrode,
wherein the anode electrode includes:
a first anode electrode disposed between the base substrate and the organic light emitting layer,
a second anode electrode disposed between the first anode electrode and the organic light emitting layer, and
a third anode electrode disposed between the second anode electrode and the organic light emitting layer,
wherein a width of the first anode electrode is equal to or greater than a width of the second anode electrode,
wherein the second anode electrode has a second side surface including a second upper side surface connected to a top surface of the second anode electrode and a second lower side surface connected to a bottom surface of the second anode electrode, and
wherein the second upper side surface and the second lower side surface form a protrusion that extends outward from the top surface and the bottom surface of the second anode electrode.

2. The display device of claim 1, wherein an end of the first anode electrode is aligned in a thickness direction with an end of the second anode electrode, or protrudes outward.

3. The display device of claim 2, wherein the first anode electrode has a first side surface, and
the first side surface is aligned with an intersection of the second upper side surface and the second lower side surface, or protrudes outward.

4. The display device of claim 2, wherein the end of the first anode electrode protrudes outward from the end of the second anode electrode by a distance within a range of and including 0 to 0.05 µm.

5. The display device of claim 1, wherein a material of the first anode electrode and a material of the third anode electrode are different from each other.

6. The display device of claim 5, wherein the material of the first anode electrode includes Indium-Zinc-Oxide (IZO), and the material of the third anode electrode includes Indium-Tin-Oxide (ITO).

7. The display device of claim 6, wherein a material of the second anode electrode includes a reflective metal, and the material of the second anode electrode includes silver (Ag).

8. The display device of claim 6, wherein the material of the first anode electrode has an alloy ratio in which a relative ratio of indium to zinc (In:Zn) is within a range and including 9:1 to 8:2.

9. The display device of claim 5, further comprising a via layer disposed between the first anode electrode and the base substrate,
wherein the via layer includes an organic insulating material, and the first anode electrode functions to increase an adhesive force between the anode electrode and the via layer.

10. The display device of claim 5, wherein the third anode electrode has a high work function compared to the second anode electrode, and functions to prevent aggregation of the second anode electrode.

11. The display device of claim 1, wherein the first anode electrode has an etching rate within a range of and including 1.25 Å/sec to 2.5 Å/sec with respect to a non-phosphoric acid-based etchant.

12. The display device of claim 11, wherein the first anode electrode and the second anode electrode are etched in a continuous process using the non-phosphoric acid-based etchant.

13. The display device of claim 12, wherein the etching of the first anode electrode and the second anode electrode with respect to the non-phosphoric acid-based etchant is completed within 60 seconds.

14. A method of manufacturing a display device, comprising:
forming an active layer on a display area of a base substrate in which the display area and a pad area located around the display area are defined;
forming a gate insulating layer on the active layer;
forming a first conductive layer on the gate insulating layer, the first conductive layer including a gate electrode on the display area and a first pad electrode on the pad area;
forming an interlayer insulating layer on the first conductive layer;
forming a second conductive layer on the interlayer insulating layer, the second conductive layer including a source electrode and a drain electrode connected to the active layer on the display area, and a second pad electrode connected to the first pad electrode on the pad area;
forming a via layer on the display area except the pad area on the second conductive layer;
forming a first anode electrode layer over the display area and the pad area on the via layer;
forming a second anode electrode layer over the display area and the pad area on the first anode electrode layer;
forming a third anode electrode layer over the display area and the pad area on the second anode electrode layer;
arranging a photoresist on the third anode electrode layer in the display area after the forming the third anode electrode layer;
forming a third anode electrode by etching the third anode electrode layer using a first etchant while using the photoresist as a mask;

forming a second anode electrode by etching the second anode electrode layer using a second etchant different from the first etchant while using the photoresist as a mask after the forming of the third anode electrode; and forming a first anode electrode by etching the first anode electrode layer using the second etchant while using the photoresist as a mask in a continuous step with the forming of the second anode electrode, wherein the forming the second anode electrode and the first anode electrode produces:

a side surface of the second anode electrode having an upper side surface connected to a top surface of the second anode electrode and a lower side surface connected to a bottom surface of the second anode electrode, and the upper side surface and the lower side of the second anode electrode form a protrusion that extends outward from the top surface and the bottom surface of the second anode electrode.

15. The method of claim 14, wherein the second etchant includes a non-phosphoric acid-based etchant, and the first etchant includes a phosphoric acid-based etchant.

16. The method of claim 15, wherein the first anode electrode layer has an etching rate within a range of and including 1.25 Å/sec to 2.5 Å/sec with respect to the non-phosphoric acid-based etchant.

17. The method of claim 15, wherein the first anode electrode layer and the second anode electrode layer are etched in a continuous process using the non-phosphoric acid-based etchant.

18. The method of claim 17, wherein the forming of the second anode electrode layer and the forming of the first anode electrode layer are completed within 60 seconds using the non-phosphoric acid-based etchant.

19. The method of claim 14, wherein a material of the first anode electrode layer and a material of the third anode electrode layer are different from each other, the material of the third anode electrode layer includes Indium-Tin-Oxide (ITO), the material of the first anode electrode layer includes Indium-Zinc-Oxide (IZO), and the material of the first anode electrode layer has an alloy ratio in which a relative ratio of indium to zinc (In:Zn) within a range and including 9:1 to 8:2.

* * * * *